United States Patent [19]

Ando et al.

[11] Patent Number: 5,798,052
[45] Date of Patent: Aug. 25, 1998

US005798052A

[54] PIEZOELECTRIC CERAMIC COMPOSITION

[75] Inventors: Akira Ando, Omihachiman; Toshikatsu Hisaki, Shiga-ken, both of Japan

[73] Assignee: Murata Manufacturing Co., Ltd., Kyoto, Japan

[21] Appl. No.: 768,406

[22] Filed: Dec. 18, 1996

[30] Foreign Application Priority Data

Dec. 20, 1995 [JP] Japan ................... 7-331833

[51] Int. Cl.$^6$ .............. C04B 35/49; C04B 35/491; C04B 35/493
[52] U.S. Cl. .......................... 252/62.9; 501/134
[58] Field of Search ............... 252/62.9; 501/134

[56] References Cited

U.S. PATENT DOCUMENTS 5,433,917  7/1995  Srivastava et al. ............ 419/22

FOREIGN PATENT DOCUMENTS

| 2940393 | 4/1981 | Germany . |
| 50-48500 | 4/1975 | Japan . |
| 3-164470 | 7/1991 | Japan . |
| 5-70225 | 3/1993 | Japan . |
| 7-291727 | 11/1995 | Japan . |

*Primary Examiner*—Melissa Bonner
*Attorney, Agent, or Firm*—Ostrolenk, Faber, Gerb & Soffen, LLP

[57] ABSTRACT

A piezoelectric ceramic composition consists essentially of a composite oxide with perovskite structure comprising Pb, Zr and Ti, and contains, as the side component, at least one of Mn and Cr, and further contains Cu. Preferably, the composition still further contains W, more preferably at $W/Cu \geq 1.1$. Even more preferably, the composition has an excess Pb content larger than the stoichiometric amount of Pb in site A of the composite oxide when represented by the general formula, $ABO_3$. The composition can be sintered at low temperatures and has good piezoelectric characteristics, for example, a high electromechanical coupling factor.

13 Claims, No Drawings

PIEZOELECTRIC CERAMIC COMPOSITION

FIELD OF THE INVENTION

The present invention relates to a piezoelectric ceramic composition and, in particular, to a piezoelectric ceramic composition which is useful as a material for monolithic harmonic resonators, monolithic harmonic filters and monolithic piezoelectric transformers.

BACKGROUND OF THE INVENTION

Recently, various electronic devices with piezoelectric ceramics have been developed and are being put into practical use. For example, known are monolithic harmonic resonators, monolithic harmonic filters and monolithic piezoelectric transformers that can be produced by forming electrode material layers on green sheets containing a piezoelectric ceramic composition, and then laminating, integrating and co-sintering them.

Regarding their characteristics, the piezoelectric ceramics for such electronic devices are desired to have a large electromechanical coupling factor (Kp) and a large mechanical quality factor (Qm).

As good piezoelectric ceramic compositions with high factors of such characteristics, well known are compositions of $Pb(Ti,Zr)O_3$. However, $Pb(Ti,Zr)O_3$ compositions generally have a high sintering temperature of 1200° C. or higher. Using such compositions, therefore, it was impossible to obtain monolithic piezoelectric devices with relatively inexpensive inner electrodes of Ag-rich Ag/Pd.

Accordingly, various modified compositions of $Pb(Ti,Zr)O_3$ have been proposed in order to lower their sintering temperature. These are produced by adding some other compounds to the basic composition of the $Pb(Ti,Zr)O_3$.

For example, in Japanese Patent Application Laid-Open No. 2-303081, disclosed is a composition of $Pb(Ni_{1/3}Nb_{2/3})O_3$-$PbZrO_3$-$PbTiO_3$ to which $Pb(Cu_{1/2}W_{1/2})O_3$ is added to thereby make it sinterable at low temperatures.

However, such conventional, low-temperature-sinterable, piezoelectric ceramic compositions as obtained by modifying the basic composition of $Pb(Ti,Zr)O_3$ were problematic in that the piezoelectric characteristics intrinsic to $Pb(Ti,Zr)O_3$ were worsened. For example, their electromechanical coupling factors (Kp) were lowered.

Given the situation, the object of the present invention is to provide a piezoelectric ceramic composition which has excellent piezoelectric characteristics, for example, has a high electromechanical coupling factor (Kp) and which can be sintered at low temperatures.

SUMMARY OF THE INVENTION

In order to attain the above-mentioned object, the present invention provides a piezoelectric ceramic composition consisting essentially of a composite oxide with perovskite structure comprising Pb, Zr and Ti, and containing, as the side component, at least one of Mn and Cr, which is characterized in that it also contains Cu.

Preferably, the piezoelectric ceramic composition further contains W, in addition to the above-mentioned elements.

Also preferably, the amount of said Cu in the composition is from about 0.01 to 5.0 atomic mol %, more preferably about 0.02 to 2%, and the amount of said W therein is from 0.01 to 5.0 atomic mol %, more preferably about 0.02 to 2%. More preferably, the atomic molar ratio of said W to said Cu in the composition is about 1.1 or more, and even more preferably at least about 1.5.

As is known, said perovskite composite oxide can be represented by the general formula $ABO_3$. It is preferable that the composition contains the Pb in an amount larger than the stoichiometric amount of Pb in the site A of said composite oxide $ABO_3$.

PREFERRED EMBODIMENTS OF CARRYING OUT THE INVENTION

Now, embodiments of the piezoelectric ceramic composition of the present invention are described hereinunder along with examples thereof.

EXAMPLE 1

First, raw materials of PbO, $TiO_2$, $ZrO_2$, $SnO_2$, $Sb_2O_3$, $MnO_2$, $Cr_2O_3$ and CuO were prepared. Next, powders of these materials were weighed to be able to obtain a ceramic composition comprising a composite oxide with perovskite structure of $0.05Pb(Sn_{1/2}Sb_{1/2})O_3$-$0.47PbTiO_3$-$0.48PbZrO_3$ (where the coefficients indicate molar fractions) along with $aMnO_2$+$bCr_2O_3$+$cCuO$ (where a, b and c indicate mol % and are shown in Table 1), then wet-milled in a ball mill together with water, and thereafter calcined at a temperature falling between 700° C. and 1000° C. for 2 hours.

After this, from 1 to 2% by weight of a polyvinyl alcohol binder was added to the thus-calcined powder, mixed, ground, dressed, and then press-shaped under a pressure of from 500 to 2000 kg/cm² to obtain circular discs each having a diameter of 12 mm and a thickness of 1.2 mm.

Next, the thus-obtained discs were baked at a temperature of 1100° C. or 1250° C. for 2 hours to give circular ceramic discs. After this, silver electrode patterns were printed on the both surfaces of each ceramic disc, to which was applied an electric field of from 1 to 5 Kv/mm for from 10 to 60 minutes in an insulating oil at from 40° to 150° C., thereby polarizing the discs.

Next, the circular piezoelectric ceramic discs thus obtained in the manner mentioned above were tested to obtain their relative dielectric constant ($\epsilon_r$), electromechanical coupling factor (Kp) and mechanical quality factor (Qm). The relative dielectric constant ($\epsilon_r$) was obtained from the capacitance measured. The electromechanical coupling factor (Kp) was obtained from the resonant frequency and the antiresonant frequency measured with an impedance measuring device. The mechanical quality factor (Qm) was obtained from the resonant frequency, the antiresonant frequency, the resonance resistance and the capacitance measured. The data obtained are shown in Table 1. In Table 1, the samples marked with * are outside the scope of the present invention and the others are within the same.

TABLE 1

| Sample No. | a | b | c | Baking Temp. (°C.) | $\epsilon_1$ | Kp (%) | Qm | Remarks |
|---|---|---|---|---|---|---|---|---|
| | (mol %) | | | | | | | |
| *1 | 1.0 | 0 | 0 | 1100 | 770 | 23.0 | 240 | |
| *2 | 1.0 | 0 | 0.005 | 1100 | 830 | 25.8 | 250 | |
| 3 | 1.0 | 0 | 0.01 | 1100 | 1240 | 39.8 | 530 | |
| 4 | 1.0 | 0 | 0.02 | 1100 | 1320 | 42.0 | 600 | |
| 5 | 1.0 | 0 | 0.05 | 1100 | 1370 | 45.7 | 650 | |
| 6 | 1.0 | 0 | 0.1 | 1100 | 1400 | 48.9 | 730 | |
| 7 | 1.0 | 0 | 0.2 | 1100 | 1420 | 48.9 | 740 | |
| 8 | 1.0 | 0 | 0.5 | 1100 | 1450 | 50.1 | 750 | |
| 9 | 1.0 | 0 | 1.0 | 1100 | 1470 | 50.4 | 750 | |
| 10 | 1.0 | 0 | 2.0 | 1100 | 1430 | 45.0 | 770 | |

TABLE 1-continued

| Sample No. | a | b (mol %) | c | Baking Temp. (°C.) | $\epsilon_1$ | Kp (%) | Qm | Remarks |
|---|---|---|---|---|---|---|---|---|
| 11 | 1.0 | 0 | 5.0 | 1100 | 1320 | 39.3 | 650 | |
| *12 | 1.0 | 0 | 0 | 1250 | 1580 | 56.5 | 770 | |
| *13 | 0 | 0.5 | 0 | 1100 | 640 | 20.8 | 210 | Insufficiently sintered. |
| 14 | 0 | 0.5 | 1.0 | 1100 | 1510 | 50.0 | 730 | |
| *15 | 0 | 0.5 | 0 | 1250 | 1510 | 56.5 | 530 | |
| 16 | 0.5 | 0.25 | 1.0 | 1100 | 1490 | 50.3 | 720 | |

As shown in Table 1, the ceramic samples of the present invention consisting essentially of $0.05Pb(Sn_{1/2}Sb_{1/2})O_3$–$0.47PbTiO_3$–$0.48PbZrO_3$ (where the coefficients indicate molar fractions) and containing, as the side component, Mn and/or Cr along with Cu, sintered at 1100° C. As opposed to these, however, when sample Nos. 1 and 13, not containing the Cu, were baked at 1100° C., the electromechanical coupling factor (Kp) and the mechanical quality factor (Qm) of the sintered sample were very low or the sample was sintered insufficiently.

The preferred range of the Cu content is from about 0.01 to 5.0 atomic mol %. Obviously in comparison with sample Nos. 12 and 15, which were baked at 1250° C., the samples of the invention having a CuO content falling within the range of from abut 0.01 to 5.0 mol % had a high relative dielectric constant ($\epsilon_r$), a high electromechanical coupling factor (Kp) and a high mechanical quality factor (Qm) even though baked at a temperature lower than 1250° C.

EXAMPLE 2

First, raw materials of PbO, $TiO_2$, $ZrO_2$, $SnO_2$, $Sb_2O_3$, $MnO_2$, CuO and $WO_3$ were prepared. Next, powders of these materials were weighed to be able to obtain a ceramic composition comprising a composite oxide with perovskite structure of $0.05Pb(Sn_{1/2}Sb_{1/2})O_3$–$0.47PbTiO_3$–$0.48PbZrO_3$ (where the coefficients indicate molar fractions) along with 1.0 mol % $MnO_2$+0.5 mol % CuO+$dWO_3$ (where d indicates mol % and is shown in Table 2), then wet-milled in a ball mill together with water, and thereafter calcined at a temperature falling between 700° C. and 1000° C. for 2 hours.

Next, in the same manner as in Example 1, these compositions were processed to obtain circular ceramic discs, on which were formed outer electrodes, and these discs were polarized. All discs were baked at 1100° C.

Also in the same manner as in Example 1, the relative dielectric constant ($\epsilon_r$), the electromechanical coupling factor (Kp) and the mechanical quality factor (Qm) of these samples were obtained. The data obtained herein are shown in Table 2.

TABLE 2

| Sample No. | $MnO_2$ | CuO (mol %) | d | $\epsilon_r$ | Kp (%) | Qm |
|---|---|---|---|---|---|---|
| 21 | 1.0 | 0.5 | 0 | 1450 | 50.1 | 750 |
| 22 | 1.0 | 0.5 | 0.005 | 1460 | 49.9 | 740 |
| 23 | 1.0 | 0.5 | 0.01 | 1480 | 50.5 | 820 |
| 24 | 1.0 | 0.5 | 0.02 | 1470 | 50.8 | 790 |
| 25 | 1.0 | 0.5 | 0.05 | 1460 | 50.7 | 810 |
| 26 | 1.0 | 0.5 | 0.1 | 1480 | 50.8 | 820 |
| 27 | 1.0 | 0.5 | 0.2 | 1470 | 50.9 | 800 |
| 28 | 1.0 | 0.5 | 0.5 | 1470 | 50.7 | 810 |
| 29 | 1.0 | 0.5 | 1.0 | 1520 | 54.0 | 980 |
| 30 | 1.0 | 0.5 | 2.0 | 1530 | 57.4 | 1030 |
| 31 | 1.0 | 0.5 | 5.0 | 1230 | 50.8 | 1100 |

As in Table 2, the ceramic samples of the present invention, consisting essentially of $0.05PB(Sn_{1/2}Sb_{1/2})O_3$–$0.47PbTiO_3$–$0.48PbZrO_3$ (where the coefficients indicate molar fractions) and containing, as the side components, Mn and Cu along with an additional element of W, had improved piezoelectric characteristics, that is, their electromechanical coupling factor (Kp) and other factors were all high.

The preferred range of the W content is from about 0.01 to 5.0 atomic mol %. Compared to sample No. 21, not containing $WO_3$, the others having a $WO_3$ content falling within the range from about 0.01 to 5.0 mol % had improved piezoelectric characteristics, that is, the electromechanical coupling factor (Kp) and the mechanical quality factor (Qm) of the latter were larger than those of the former.

EXAMPLE 3

First, raw materials of PbO, $TiO_2$, $ZrO_2$, $SnO_2$, $Sb_2O_3$, $MnO_2$, $Cr_2O_3$, CuO and $WO_3$ were prepared. Next, powders of these materials were weighed to be able to obtain a ceramic composition comprising a composite oxide with perovskite structure of $0.05Pb(Sn_{1/2}Sb_{1/2})O_3$–$0.47PbTiO_3$–$0.48PbZrO_3$ (where the coefficients indicate molar fractions) along with $aMnO_2$+$bCr_2O_3$+$cCuO$+$dWO_3$+ePbo (where a, b, c, d and e indicate mol % and are shown in Table 3), then wet-milled in a ball mill together with water, and thereafter calcined at a temperature falling between 700° C. and 1000° C. for 2 hours.

Next, in the same manner as in Example 1, these compositions were processed to obtain circular ceramic discs, on which were formed outer electrodes, and these discs were polarized. All discs were baked at 1100° C.

Also in the same manner as in Example 1 the relative dielectric constant ($\epsilon_r$), the electromechanical coupling factor (Kp) and the mechanical quality factor (Qm) of these samples were obtained. The data obtained herein are shown in Table 3.

TABLE 3

| Sample No. | a | b | c (mol %) | d | e | $\epsilon_1$ | Kp (%) | Qm |
|---|---|---|---|---|---|---|---|---|
| 41 | 1.0 | 0 | 1.0 | 0 | 0 | 1470 | 50.4 | 750 |
| 42 | 1.0 | 0 | 0.5 | 0.5 | 0 | 1470 | 50.7 | 810 |
| 43 | 1.0 | 0 | 0.49 | 0.51 | 0 | 1490 | 50.5 | 830 |
| 44 | 1.0 | 0 | 0.475 | 0.525 | 0 | 1510 | 52.0 | 980 |
| 45 | 1.0 | 0 | 0.45 | 0.55 | 0 | 1510 | 52.2 | 1010 |
| 46 | 1.0 | 0 | 0.4 | 0.6 | 0 | 1540 | 52.3 | 1060 |
| 47 | 1.0 | 0 | 0.3 | 0.7 | 0 | 1490 | 54.2 | 1070 |
| 48 | 1.0 | 0 | 0.2 | 0.8 | 0 | 1420 | 54.8 | 1040 |
| 49 | 1.0 | 0 | 0.1 | 0.9 | 0 | 1400 | 55.5 | 1000 |
| 50 | 1.0 | 0 | 1.0 | 0 | 0.5 | 1530 | 52.1 | 940 |
| 51 | 1.0 | 0 | 0.1 | 0.9 | 0.5 | 1510 | 56.1 | 1030 |
| 52 | 0 | 0.5 | 0.5 | 0.5 | 0 | 1480 | 50.8 | 680 |
| 53 | 0 | 0.5 | 0.4 | 0.6 | 0 | 1490 | 53.1 | 700 |
| 54 | 0 | 0.5 | 0.1 | 0.9 | 0 | 1450 | 55.6 | 740 |
| 55 | 0 | 0.5 | 0.1 | 0.9 | 0.5 | 1480 | 56.2 | 780 |
| 56 | 0.5 | 0.25 | 0.1 | 0.9 | 0 | 1520 | 55.9 | 1030 |

As seen in Table 3, the preferred range of the atomic molar ratio of the element W to the element Cu is about 1.1 or more in the ceramic composition of the present invention that consists essentially of $0.05Pb(Sn_{1/2}Sb_{1/2})O_3-0.47PbTiO_3-0.48PbZrO_3$ (where the coefficients indicate molar fractions) and contains, as the side components, Mn and/or Cr along with W and Cu. Concretely, the sample Nos. 44 to 49, 53, 54 and 56, having a molar ratio, $WO_3$ to CuO, of about 1.1 or more had improved piezoelectric characteristics than the others, Nos. 41 to 43 and 52, having a molar ratio, $WO_3$ to CuO, of less than 1.1, that is, the electromechanical coupling factor (Kp) and the mechanical quality factor (Qm) of the former were larger than those of the latter.

Comparing sample Nos. 50, 51 and 55, having a Pb content larger than the stoichiometric amount of Pb in site A of the composite oxide represented by the general formula, $ABO_3$, with the sample Nos. 41, 49 and 54, not having such an excess Pb content, the former had better piezoelectric characteristics than the latter, that is, the electromechanical coupling factor (Kp) and the mechanical quality factor (Qm) of the former were larger than those of the latter.

In the above-mentioned embodiments, the additives to the basic compositions were in the form of single metal oxides, which, however, are not limitative. They may also be added to the basic compositions in the form of their carbonates or composite oxides such as $PbWO_4$ to attain the same effects as above.

In the above-mentioned embodiments, the composite oxide for the essential component with perovskite structure illustrated was $0.05Pb(Sn_{1/2}Sb_{1/2})O_3-0.47PbTiO_3-0.48PbZrO_3$, which, however is not also limitative. Apart from the form of the composite oxide illustrated, the composite oxide may have any other form with the perovskite comprising Pb, Zr and Ti, such as $Pb(Mn_{1/3}Nb_{2/3})O_3-PbTiO_3-PbZrO_3$, $Pb(Mn_{1/3}Sb_{2/3})O_3-PbTiO_3-PbZrO_3$, or $Pb(Ni_{1/3}Nb_{2/3})O_3-PbTiO_3-PbZrO_3$, and the piezoelectric ceramic compositions consisting essentially of the composite oxide of such a type can also attain the same effects as above.

As is obvious from the above-mentioned description, the incorporation of an additional element of Cu into a piezoelectric ceramic composition consisting essentially of a composite oxide with perovskite structure comprising elements of Pb, Zr and Ti and containing, as the side component, Mn and/or Cr makes the composition have improved piezoelectric characteristics and makes it sinterable at low temperatures.

Preferably, the composition further contains W, more preferably at an atomic molar ratio, W to Cu, of about 1.1 or more. The composition of this type may have more improved piezoelectric characteristics.

It is more preferred to make the composition have an excess Pb content larger than the stoichiometric amount of Pb in site A of the composite oxide when represented by the general formula $ABO_3$. The composition of this type may have much more improved piezoelectric characteristics and can be sintered at low temperatures.

Accordingly, using the piezoelectric ceramic composition of the present invention, it is possible to produce monolithic piezoelectric devices, such as monolithic harmonic resonators, monolithic harmonic filters and monolithic piezoelectric transformers, which have internal electrodes of relatively inexpensive Ag/Pd and have good piezoelectric characteristics.

While the invention has been described in detail and with reference to specific embodiments thereof, it will be apparent to one skilled in the art that various changes and modifications can be made therein without departing from the spirit and scope thereof.

What is claimed is:

1. The piezoelectric ceramic composition which is an oxide consisting essentially of a composite oxide with perovskite structure comprising Pb, Zr, Ti, Cu at least one of Mn and Cr, and optionally W, and which contains Pb in an amount larger than the stoichiometric amount of Pb in site A of said composite oxide when represented by the general formula $ABO_3$.

2. The piezoelectric ceramic composition as claimed in claim 1, wherein the amount of said Cu is from about 0.01 to 5.0 atomic mol %.

3. The piezoelectric ceramic composition as claimed in claim 2, wherein the amount of said Cu is about 0.02 to 2 atomic mol %.

4. The piezoelectric ceramic composition as claimed in claim 1, which further contains W.

5. The piezoelectric ceramic composition as claimed in claim 4, wherein the amount of said Cu is from about 0.01 to 5.0 atomic mol %.

6. The piezoelectric ceramic composition as claimed in claim 5, wherein the amount of said W is from about 0.01 to 5.0 atomic mol %.

7. The piezoelectric ceramic composition as claimed in claim 6, wherein the amount of said Cu and W are each about 0.02 to 2 atomic mol %.

8. The piezoelectric ceramic composition as claimed in claim 7, wherein the atomic molar ratio of said W to said Cu is about 1.1 or more.

9. The piezoelectric ceramic composition as claimed in claim 8, wherein the atomic molar ratio of said W to said Cu is at least 1.5.

10. The piezoelectric ceramic composition as claimed in claim 6, wherein the atomic molar ratio of said W to said Cu is about 1.1 or more.

11. The piezoelectric ceramic composition as claimed in claim 10, wherein the atomic molar ratio of said W to said Cu is at least 1.5.

12. The piezoelectric ceramic composition as claimed in claim 4, wherein the atomic molar ratio of said W to said Cu is about 1.1 or more.

13. The piezoelectric ceramic composition as claimed in claim 12, wherein the atomic molar ratio of said W to said Cu is at least 1.5.

* * * * *